United States Patent
Koike

(10) Patent No.: US 6,649,997 B2
(45) Date of Patent: *Nov. 18, 2003

(54) SEMICONDUCTOR DEVICE HAVING FUSES OR ANTI-FUSES

(75) Inventor: Hidetoshi Koike, Yokohama (JP)

(73) Assignee: Kabushiki Kaisha Toshiba, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/411,590

(22) Filed: Oct. 4, 1999

(65) Prior Publication Data

US 2002/0063305 A1 May 30, 2002

(30) Foreign Application Priority Data

Oct. 5, 1998 (JP) .............................. 10-282612

(51) Int. Cl.[7] .............................................. H01L 29/00
(52) U.S. Cl. ...................... 257/529; 257/530; 257/758; 257/759
(58) Field of Search ................................ 257/529, 530, 257/758, 759, 760, 531

(56) References Cited

U.S. PATENT DOCUMENTS

| | | | |
|---|---|---|---|
| 5,300,456 A | * | 4/1994 | Tigelaar et al. ...... 148/DIG. 55 |
| 5,427,979 A | * | 6/1995 | Chang ........................ 257/529 |
| 5,451,810 A | * | 9/1995 | Tigelaar et al. ................ 257/50 |
| 5,589,706 A | | 12/1996 | Mitwalsky et al. |
| 5,608,257 A | * | 3/1997 | Lee et al. ..................... 257/208 |
| 5,808,363 A | * | 9/1998 | Watanabe .................... 257/758 |
| 5,895,963 A | | 4/1999 | Yamazaki |
| 5,914,524 A | * | 6/1999 | Komenaka ................... 257/209 |
| 5,962,911 A | * | 10/1999 | Manley ........................ 257/50 |
| 6,078,091 A | * | 6/2000 | MacPherson ................ 257/529 |
| 6,096,566 A | * | 8/2000 | MacPherson ................ 438/132 |
| 6,100,116 A | * | 8/2000 | Lee ............................. 438/128 |
| 6,100,117 A | * | 8/2000 | Hao ............................ 438/132 |
| 6,177,714 B1 | * | 1/2001 | Nagai .......................... 257/529 |
| 6,261,883 B1 | * | 7/2001 | Koubuchi et al. ........... 257/776 |
| 6,307,213 B1 | * | 10/2001 | Huang et al. ................. 257/50 |
| 2002/0050646 A1 | * | 5/2002 | Ohhashi ...................... 257/758 |
| 2002/0074611 A1 | * | 6/2002 | Koubuchi et al. ........... 257/401 |

FOREIGN PATENT DOCUMENTS

JP 04-014245 1/1992

OTHER PUBLICATIONS

Japanese Patent Office "Notification of Reasons for Rejection", Mailing No. 163986, May 28, 2002.

* cited by examiner

Primary Examiner—Wael Fahmy
Assistant Examiner—Nathan W. Ha
(74) Attorney, Agent, or Firm—Hogan & Hartson, LLP

(57) ABSTRACT

A laminated dummy pattern formed of plural metals including aluminum and tungsten is formed below a fuse or anti-fuse and an influence by application of laser energy at the time of laser blow on an wiring or element can be prevented.

18 Claims, 4 Drawing Sheets

SEMICONDUCTOR DEVICE HAVING FUSES OR ANTI-FUSES

BACKGROUND OF THE INVENTION

This invention relates to a semiconductor device having a multi-layered wiring structure formed by sequentially laminating a wiring layer and an inter-layer insulation film on a semiconductor substrate and fuses or anti-fuses incorporated into the multi-layered wiring structure.

It becomes impossible to require that the whole chip can be made free from any defect as the integration density of the semiconductor memory becomes higher and the memory capacity thereof is increased. To this end, a method for compensating for a defective cell by use of a spare cell of a redundancy circuit previously formed is widely used in a memory LSI or an LSI having a memory mounted thereon. In order to use the spare cell instead of the defective cell, the memory is constructed such that, generally, the address of the defective cell detected and stored by use of a tester and then a fuse formed in the wiring layer made of polysilicon or aluminum is cut off by use of laser or an anti-fuse is connected by use of laser so as to permit the spare cell to be used instead of the defective cell.

However, since laser of a certain amount of energy is required to cut off the fuse or connect the anti-fuse by use of laser, a wiring or semiconductor element may be greatly damaged if it is formed below the wiring layer in which the fuse or anti-fuse is formed. Therefore, the wiring or semiconductor element cannot be formed below the fuse or anti-fuse forming layer. This is also an obstacle to further enhancement of the integration density of the LSI.

If the uppermost aluminum wiring can be used as the wiring layer to be used as the fuse or anti-fuse, it is generally convenient in the process since laser can be directly applied to the uppermost aluminum wiring layer. However, since the uppermost aluminum wiring is generally formed with a film thickness of one micron or more to reduce the resistance thereof and is made extremely thicker than the other wiring layer whose film thickness is 0.6 micron or less, it is required to use laser of large energy in order to cut off the fuse if the uppermost aluminum wiring is used as the fuse. In this case, a wiring or semiconductor element cannot be formed below the fuse formed layer and enhancement of the integration density cannot be expected. The same problem occurs in the case of anti-fuse.

An object of this invention is to provide a semiconductor device having a multi-layered wiring structure in which the number of manufacturing steps can be suppressed, the integration density can be enhanced and the desired characteristics can be maintained after cut-off of the fuse or connection of the anti-fuse is performed while wiring layers or elements formed below fuses or anti-fuses can be made free from an influence caused by the application of laser at the time of cut-off of the fuse or connection of the anti-fuse.

BRIEF SUMMARY OF THE INVENTION

A semiconductor device of this invention comprises a semiconductor substrate and a multi-layered wiring structure formed on the semiconductor substrate, wherein the multi-layered wiring structure includes wirings having fuses or anti-fuses formed in a first wiring layer and a dummy pattern or patterns formed of a metal laminated film formed in a second wiring layer directly below the first wiring layer in which fuses or anti-fuses are formed.

Further, a semiconductor device of this invention comprises a semiconductor substrate, a multi-layered wiring structure formed on the semiconductor substrate and a passivation film formed on the multi-layered wiring structure, wherein the multi-layered wiring structure has a wiring including fuses or anti-fuses formed in a predetermined wiring layer and windows having openings formed above the fuses or anti-fuses, and the dummy pattern has an area which is not larger than an area of the window.

With the above structure, since laser energy applied for cut-off of the fuse or connection of the anti-fuse is effectively absorbed by the dummy pattern formed directly below the fuse or anti-fuse, wirings or semiconductor elements can be formed below the dummy pattern, the number of manufacturing steps will not be increased, the integration density can be enhanced and the stable operation can be attained even after cut-off of the fuse or connection of the anti-fuse.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A manufacturing process according to a first embodiment in which this invention is applied to a 4-layered metal wiring LSI having metal fuses will now be described with reference to the accompanying drawings.

Figure 1:
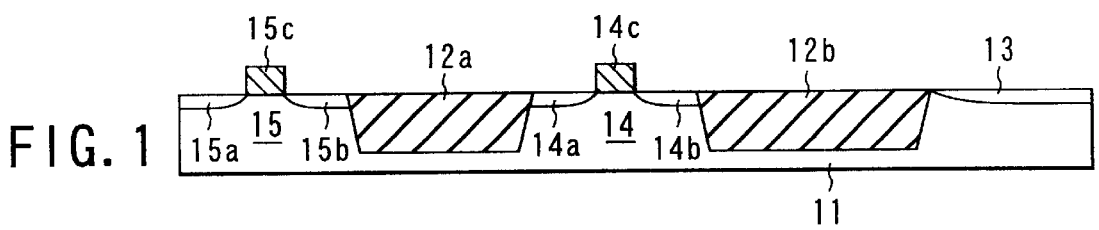
FIG. 1 is a cross sectional view showing the initial manufacturing step in a first embodiment in which this invention is applied to a manufacturing process of a memory LSI.

In FIG. 1, a plurality of (in this embodiment, only two of them are shown) element isolation regions 12a, 12b are formed on a silicon substrate 11 and passive elements including a diffusion layer 13 and active elements including a MOSFET 14 formed of diffusion layers 14a, 14b and a gate electrode 14c and a MOSFET 15 formed of diffusion layers 15a, 15b and a gate electrode 15c are formed in element forming regions isolated by the element isolation regions 12a, 12b. A fuse is formed above the MOSFET 14 with a dummy pattern disposed therebetween as will be described later.

Figure 2:
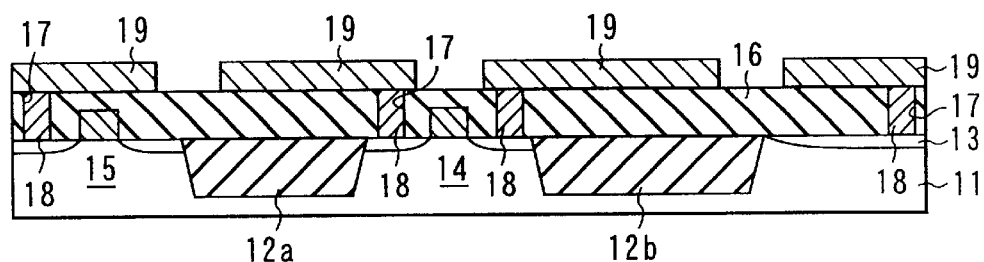
FIG. 2 is a cross sectional view showing a manufacturing step following the manufacturing step of FIG. 1.

Next, as shown in FIG. 2, a first inter-layer insulation film 16 such as a BPSG film is formed on the entire surface of the silicon substrate 11 and then it is made flat by use of a normal CMP method. After this, first contact holes 17 are formed through the first inter-layer insulation film 16 up to the diffusion layers 13, 14a, 14b, 15a, 15b by using a photolithography process. First tungsten layers 18 are filled into the first contact holes 17 by use of the CVD method. The lower end portions of the first tungsten layers 18 are respectively connected to the diffusion layers 13, 14a, 14b, 15a, 15b.

Then, an aluminum layer is formed on the entire surface of the first inter-layer insulation film 16 and patterned by use of the photolithography technology to form first aluminum wiring layers 19 of predetermined patterns.

Figure 3:
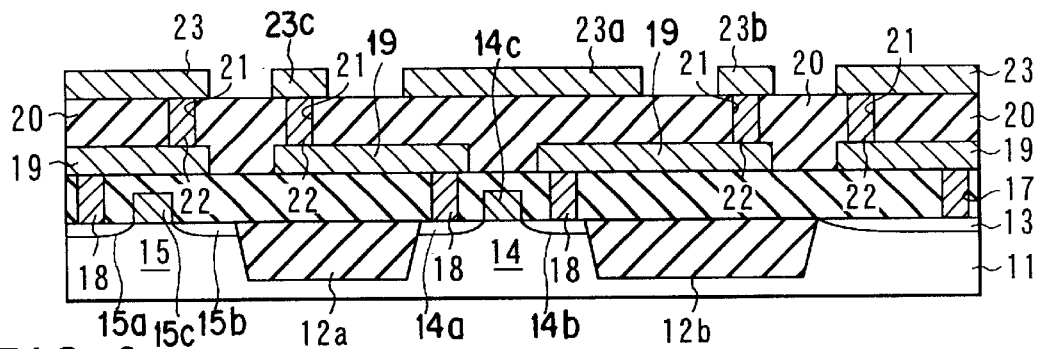
FIG. 3 is a cross sectional view showing a manufacturing step following the manufacturing step of FIG. 2.

Next, as shown in FIG. 3, a second inter-layer insulation film 20 such as an $SiO_2$ film is formed on the first aluminum wiring layers 19 and then it is made flat by use of the CMP method. After this, second contact holes 21 for connection with the first aluminum wiring layers 19 are formed in predetermined portions of the second inter-layer insulation film 20 and then second tungsten layers 22 are filled into the second contact holes 21 by use of the CVD method.

Further, an aluminum layer is formed on the entire surface of the second inter-layer insulation film 20 and patterned by use of the photolithography technology to form a second aluminum wiring layer of a predetermined pattern. At the time of patterning, the aluminum dummy pattern 23a is formed to completely cover the diffusion layers 14a, 14b and the gate electrode 14c of the MOSFET 14 formed in the step of FIG. 1 with portions thereof overlapping the element isolation regions 12a, 12b. For example, the size of the aluminum dummy pattern 23a is 4 μm×4 μm.

Since the aluminum dummy pattern 23a is formed at the same time that the second aluminum wiring layer is patterned, the number of manufacturing steps is not increased in order to form the aluminum dummy pattern 23a.

Further, at the time of patterning, an aluminum portion between the aluminum dummy pattern 23a and one of the aluminum patterns 23b and 23c may be remained so that the dummy pattern 23a is connected to one of the diffusion layers 15a, 15b of the MOSFET 14 formed in the step of FIG. 1. That is, since the dummy pattern 23a is connected to at least one the diffusion layer 15a, 15b, thermal damage by application of laser can be released to the silicon substrate 11 via a PN junction between the diffusion layers 15a, 15b and the silicon substrate 11 when a fuse to be formed in the later step is subjected to the blow process by use of laser. As a result, the damage will not be given to other wirings or elements.

In this case, since an electrical conductive path is formed between the dummy pattern 23a and the silicon substrate 11, the potential of the dummy pattern 23a is fixed at the potential of the silicon substrate 11 so that the wiring capacitance of the dummy pattern 23a can be kept constant and static electricity can be discharged via the silicon substrate 11 even if the static electricity is accumulated in the dummy pattern 23a during the manufacturing process, thereby preventing occurrence of the dielectric breakdown due to the static electricity.

Figure 4:
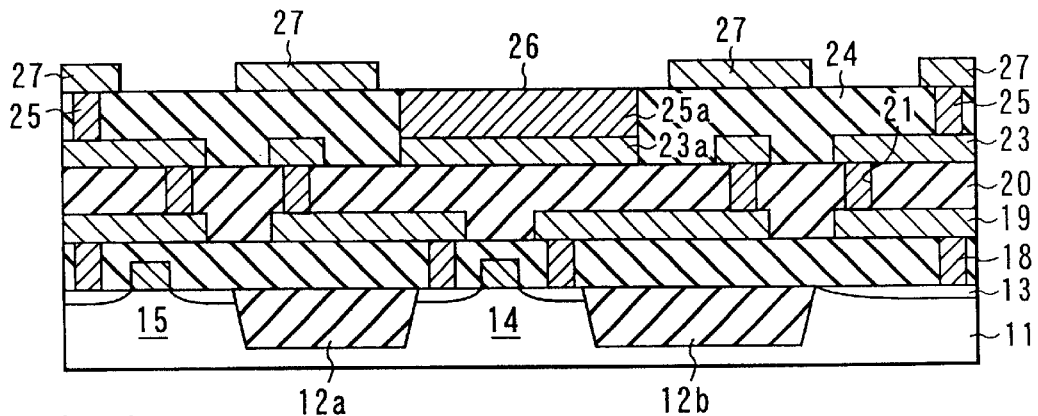
FIG. 4 is a cross sectional view showing a manufacturing step following the manufacturing step of FIG. 3.

Next, as shown in FIG. 4, a third inter-layer insulation film 24 such as an $SiO_2$ film is formed on the second aluminum wiring layers 23 including the dummy pattern 23a and then it is made flat by use of the CMP method.

After this, third contact holes for connection with the second aluminum wiring layers 23 are formed in predetermined portions of the third inter-layer insulation film 24 by etching and then third tungsten plugs 25 are filled into the third contact holes by use of the CVD method.

At the time of formation of the third contact holes, the third inter-layer insulation film 24 is selectively removed by etching to expose the entire surface of the aluminum dummy pattern 23a included in the second aluminum wiring layers 23 and then a tungsten dummy pattern 25a formed of the same material as the third tungsten plug 25 is deposited on the exposed surface of the dummy pattern 23a.

As a result, a laminated dummy pattern 26 having the aluminum dummy pattern 23a and tungsten dummy pattern 25a laminated on each other is formed. Also, in this case, the tungsten dummy pattern 25a can be formed at the same time as the step of filling the third tungsten plugs 25.

Thus, since the aluminum dummy pattern 23a is formed at the time of formation of the second aluminum wiring layers 23 and the tungsten dummy pattern 25a is deposited in the next step of filling the third tungsten plugs 25, the dummy pattern 26 which is far thicker than in a case wherein the individual dummy patterns 23a, 25a are used can be formed.

Further, it is not necessary to add a special process in order to form the thick dummy pattern 26. Since the thick dummy pattern 26 effectively absorbs laser energy at the time of laser blow, for example, an uppermost aluminum layer with a thickness of one micron which cannot be used in the prior art can be used as a fuse.

Since the melting point of tungsten used for forming the tungsten dummy pattern 25a is as high as 3387° C., the dummy pattern 26 is difficult to melt even if it absorbs more laser energy than a case in which the dummy pattern 23a of single aluminum layer at the time of laser blow is used and the thick dummy pattern 26 is convenient for blocking the laser energy.

Further, another aluminum layer is deposited on the entire surface of the third inter-layer insulation film 24 and patterned into third aluminum wiring layers 27 of predetermined patterns by use of the photolithography technology.

At the time of formation of the third aluminum wiring layers 27, the etching process is effected to expose the surface of the tungsten dummy pattern 25a of a laminated dummy pattern 26 having the aluminum dummy pattern 23a and the tungsten dummy pattern 25a laminated on each other.

However, it is not definitely required to effect the etching process until the surface of the tungsten dummy pattern 25a is exposed for the reason of the process. In this case, a part of the third inter-layer insulation film 24 may be remained between the aluminum dummy pattern 23a and the tungsten dummy pattern 25a.

Figure 5:
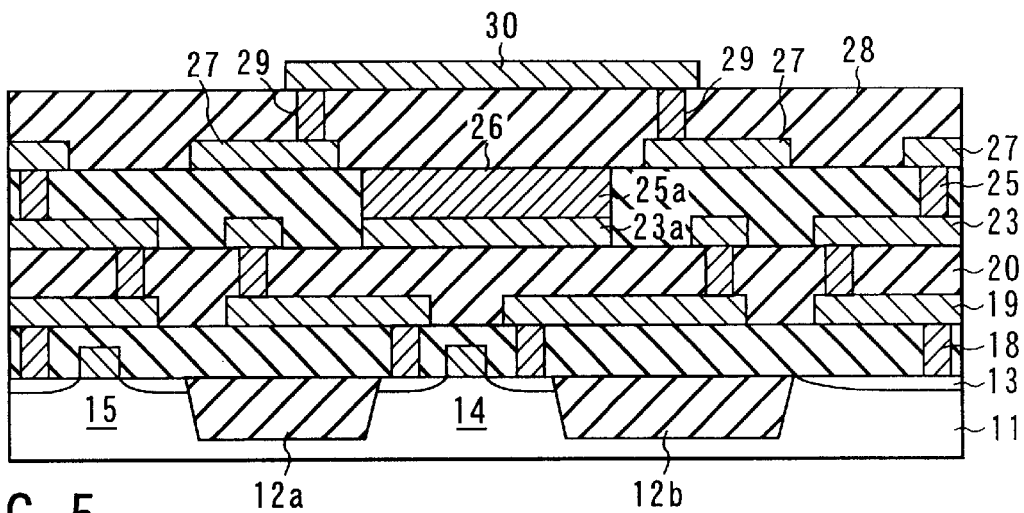
FIG. 5 is a cross sectional view showing a manufacturing step following the manufacturing step of FIG. 4.

Next, as shown in FIG. 5, a fourth inter-layer insulation film 28 such as an SiO$_2$ film is formed on the third aluminum wiring layers 27 and then it is made flat by use of the CMP method. After this, fourth contact holes for connection with the third aluminum wiring layers 27 are formed in predetermined portions of the fourth inter-layer insulation film 28 by etching and then fourth tungsten plugs 29 are filled into the fourth contact holes by use of the CVD method.

Further, a fourth aluminum layer is formed to a thickness of one micron on the entire surface of the fourth inter-layer insulation film 28 and patterned into a predetermined form by use of the photolithography technology to form a metal fuse 30 of aluminum directly above the laminated dummy pattern 26. In this case, the whole portion of the metal fuse 30 can be used as a fuse, but it is also possible to make the central portion thereof be narrow and use the narrow portion as a fuse, for example.

Figure 6:
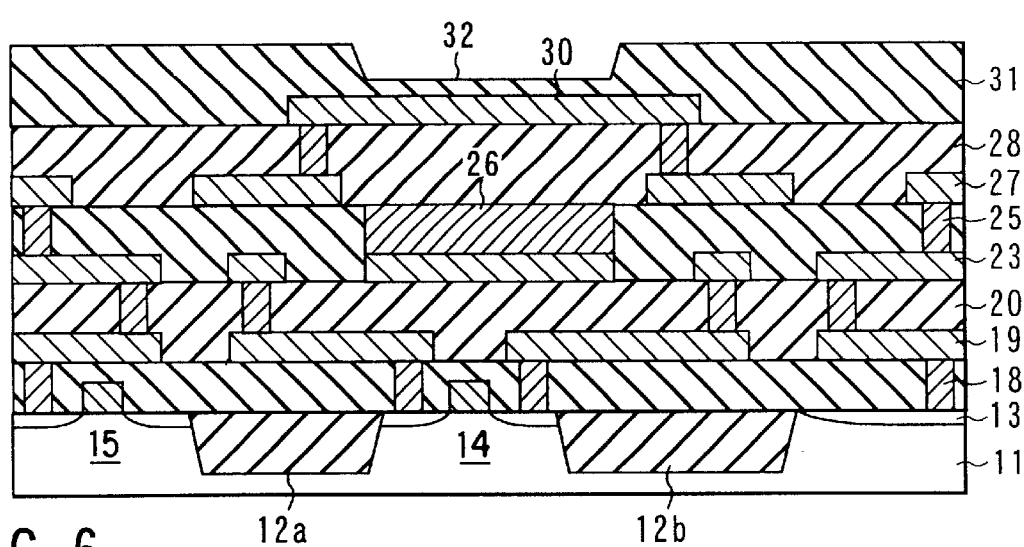
FIG. 6 is a cross sectional view showing a manufacturing step following the manufacturing step of FIG. 5.

Finally, as shown in FIG. 6, a passivation film 31 such as a silicon nitride (Si$_3$N$_4$) film is deposited to cover the entire surface of the fourth aluminum wiring layer containing the metal fuse 30 and a portion of the passivation film 31 which lies on the metal fuse 30 is selectively etched by use of the photolithography technology so as to form a fuse window 32.

At this time, the etching process is effected so as to leave a small portion of the passivation film 31 which lies on the metal fuse 30 so that the metal fuse 30 will not be exposed and the performance of the metal fuse 30 as a fuse will be prevented from being deteriorated.

Since the passivation film 31 does not almost absorb laser energy, no problem occurs even if a small portion of the passivating film 31 is left behind on the metal fuse 30.

In this embodiment, the size of the opening of the fuse window 32 and the size of the laminated dummy pattern 26 are set to the same size of 4 μm×4 μm, but it is also possible to set the size of the laminated dummy pattern 26 smaller than the size of the opening of the fuse window 32.

That is, the size of the laminated dummy pattern 26 can be made smaller than the size of the opening of the fuse window 32 if it is larger than the spot diameter of laser which is determined according to the wiring width of the metal fuse 30.

Since the size of the laminated dummy pattern 26 can be made smaller than the size of the opening of the fuse window 32, the presence of the laminated dummy pattern 26 does not cause any obstacle to enhancement of the integration density of the LSI. Further, since wirings or elements can be formed below the laminated dummy pattern 26 in a range of 4 μm in the lateral direction with respect to the metal fuse 30 on the same plane, the integration density can be enhanced by a corresponding amount.

Further, in the embodiment described above, the laminated dummy pattern 26 is formed by laminating the aluminum dummy pattern 23a and the tungsten dummy pattern 25a on each other, but the laminated structure of the laminated dummy pattern can be variously modified.

The potential of the laminated dummy pattern 26 is set in an electrically floating state and it does not give an influence of damage by application of laser at the time of fuse blow to other wirings or elements. Further, although not shown in the drawing, if the laminated dummy pattern 26 is connected to a fixed potential portion instead of setting the potential thereof in an electrically floating state, the wiring capacitance of the dummy pattern 26 can always be kept constant.

Figure 7:
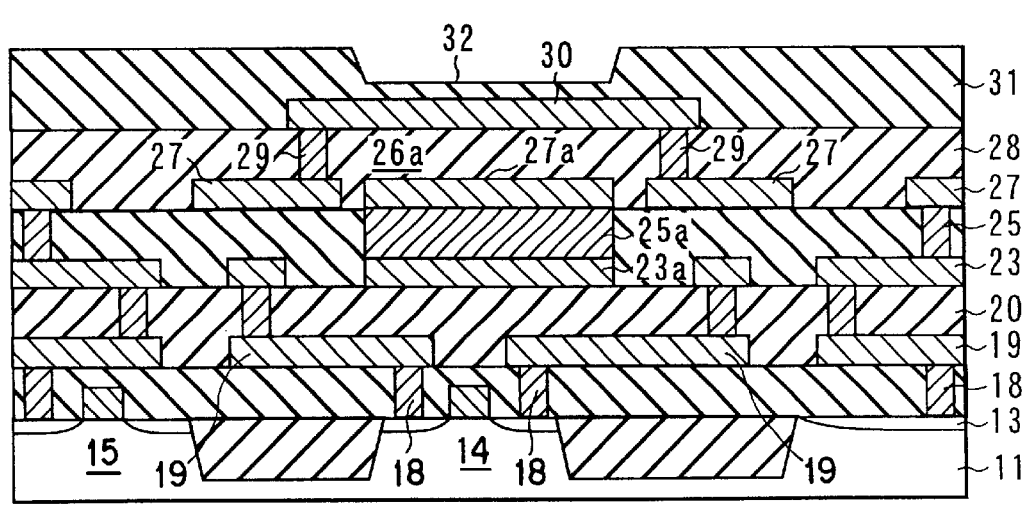
FIG. 7 is a cross sectional view showing the last step of a manufacturing process of a second embodiment of this invention.

FIG. 7 is a cross sectional view showing the last step of the manufacturing process of a semiconductor device according to a second embodiment having another dummy pattern structure, but it is almost the same as the embodiment of FIG. 6 and portions which are substantially the same as those in the embodiment of FIG. 6 are denoted by the same reference numerals and the explanation therefor is omitted.

The embodiment of FIG. 7 is different from the embodiment of FIG. 6 in that the etching process is effected to leave the aluminum dummy pattern 27a on the tungsten dummy pattern 25a when the third aluminum wiring layer 27 is formed in the step of FIG. 4. The other portions are the same as those of the first embodiment.

According to the second embodiment, since a laminated dummy pattern 26a of three-layered structure constructed by an aluminum dummy pattern 23a formed of a second aluminum layer which lies below the metal fuse 30, a tungsten dummy pattern 25a formed of a third tungsten layer and an aluminum dummy pattern 27a formed of a third aluminum layer is formed, the wirings 19 and contacts 18 and MOSFET 14 formed below the laminated dummy pattern 26a can be more effectively protected from damage caused by the application of laser at the time of blow of the fuse 30.

Therefore, since a wiring or element can be formed in a portion below the laminated dummy pattern 26a and its neighborhood, the area of a defect relieving circuit containing fuses can be reduced in comparison with the area thereof in the prior art and, in this case, the number of manufacturing processes is not increased.

In either of the embodiments described above, an attempt is made to prevent wirings or elements from being damaged by application of laser at the time of fuse blow by forming the fuse in the uppermost wiring layer and forming the laminated dummy pattern in the wiring layer which lies below the fuse by one layer or two layers. This invention is not limited to the above case, and the fuse may be formed in a layer other than the uppermost layer, for example, in a wiring layer next to the uppermost layer. That is, if the dummy pattern is formed below the fuse, the same effect can be attained.

Further, this invention can be applied to a case wherein an attempt is made to prevent wirings or elements from being damaged by application of laser at the time of anti-fuse blow other than the fuse.

Figure 8:
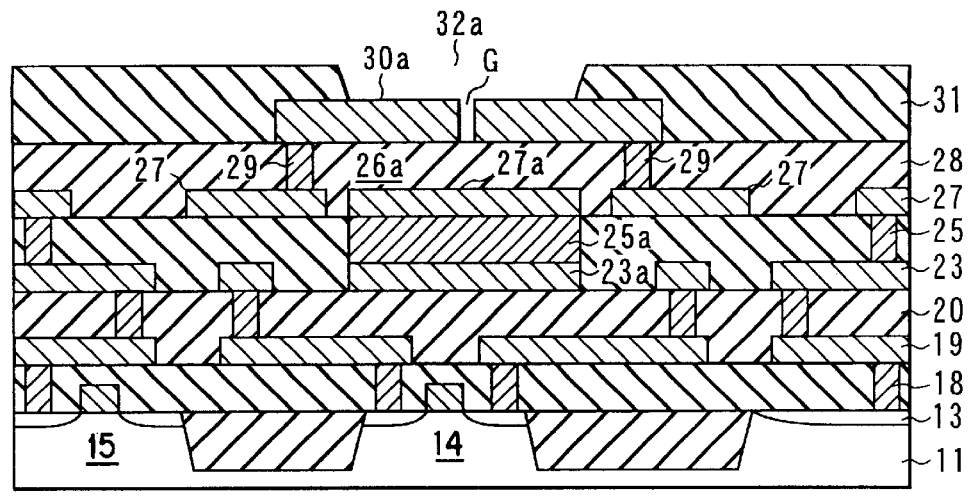
FIG. 8 is a cross sectional view showing the last step of a manufacturing process of a third embodiment of this invention.

FIG. 8 is a cross sectional view showing a third embodiment showing one example of the above case, but since the embodiment is almost the same as the embodiment of FIG. 7 except that an anti-fuse is formed instead of the fuse 30 in the embodiment of FIG. 7, portions which are substantially the same as those in the embodiment of FIG. 7 are denoted by the same reference numerals and the explanation therefor is omitted.

In FIG. 8, a fourth inter-layer insulation film 28 such as an SiO$_2$ film is formed on the third aluminum wiring layers 27 and then it is made flat by use of the CMP method. After fourth tungsten plugs 29 are filled into fourth contact holes by use of the CVD method, a fourth aluminum layer is deposited to a thickness of approx. one micron on the entire surface and patterned into a predetermined form by use of the photolithography technology to form an anti-metal fuse 30a of aluminum above the laminated dummy pattern 26a. The anti-metal fuse 30a has a gap G of a predetermined interval therein.

Further, a passivation film 31 such as a silicon nitride (Si$_3$N$_4$) film is deposited to cover the entire surface of a fourth aluminum wiring layer containing the anti-metal fuse 30a and a portion of the passivation film 31 which lies on the gap G of the anti-metal fuse 30a is selectively etched by use of the photolithography technology so as to form a fuse window (anti-fuse window) 32a and expose the fourth inter-layer insulation film 28 on the bottom portion of the gap G.

In this embodiment, the size of the laminated dummy pattern 26a is set to 4 μm×4 μm and the fuse window 32a is formed in position directly above the central portion of the anti-metal fuse 30a with the size of the uppermost portion of the opening 32a thereof larger than the dummy pattern 26a.

Next, one example of a concrete construction of a portion of the fuse and the state of the fuse cut off as the result of blow by laser are explained with reference to FIGS. 9 and 10 in a case where a single fuse window 32 larger than the laminated dummy pattern 26a is formed.

Figure 9:
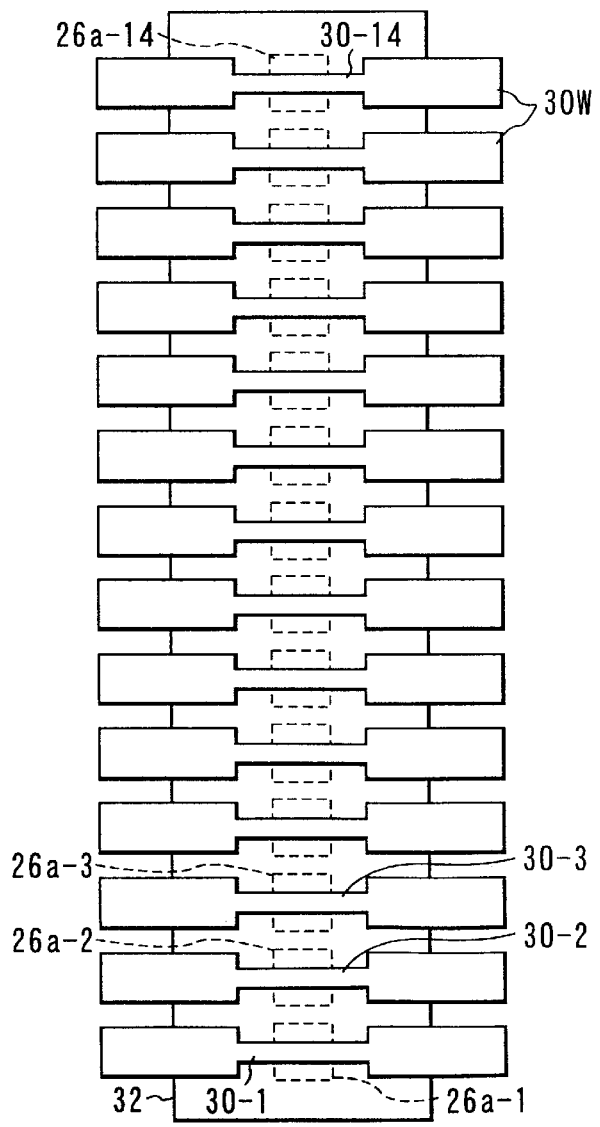
FIG. 9 is a plan view showing a state in which a plurality of metal fuses before laser blow and a plurality of corresponding dummy patterns are arranged at substantially equal intervals and in substantially parallel to each other in one fuse window.

FIG. 9 shows a state in which 14 metal fuses 30-1 to 30-14 before the laser blow process is effected are arranged at substantially the same intervals and in parallel to one another in the single fuse window 32. The respective metal fuses 30-1 to 30-14 are each formed with a narrow pattern in the intermediate portion of a wide wiring portion 30W. Laminated dummy patterns 26a-1 to 26a-14 are respectively formed directly below the narrow metal fuses 30-1 to 30-14 inside the fuse window 32 with the fourth inter-layer insulation film 28 disposed therebetween.

The metal fuses 30-1 to 30-14 are selectively cut off by application of laser so as to permit a spare cell to be active instead of a defective cell when the redundancy circuit is required to be used instead of the defective cell.

Figure 10:
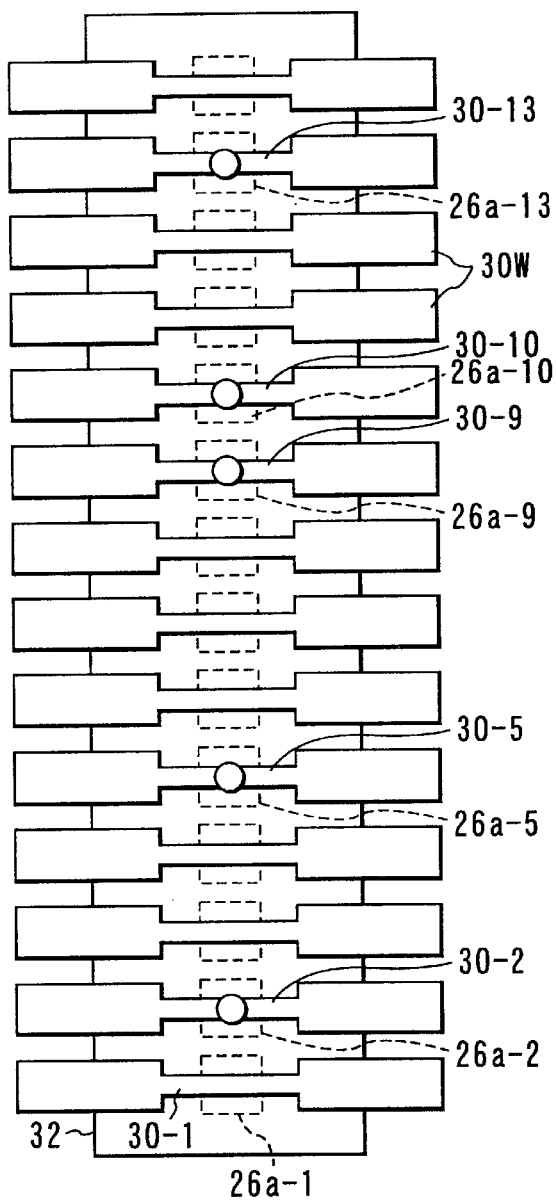
FIG. 10 is a plan view showing a state in which a plurality of metal fuses are selectively cut off after laser blow in the structure of FIG. 9.

FIG. 10 shows a state in which the five metal fuses 30-2, 30-5, 30-9, 30-10, 30-13 in the structure of FIG. 9 are blown by application of laser and cut off. In this case, the dummy patterns 26a-2, 26a-5, 26a-9, 26a-10, 26a-13 are formed in position corresponding to the metal fuses 30-2, 30-5, 30-9, 30-10, 30-13 and wirings or elements formed below the respective dummy patterns are protected from being damaged by laser blow.

In the embodiment shown in FIG. 9, a plurality of dummy patterns 26a-1 to 26a-14 are respectively formed in position corresponding to a plurality of metal fuses 30-1 to 30-14 formed in the fuse window 32, but it is also possible to form a single dummy pattern commonly used for a plurality of metal fuses 30-1 to 30-14.

Figure 11:
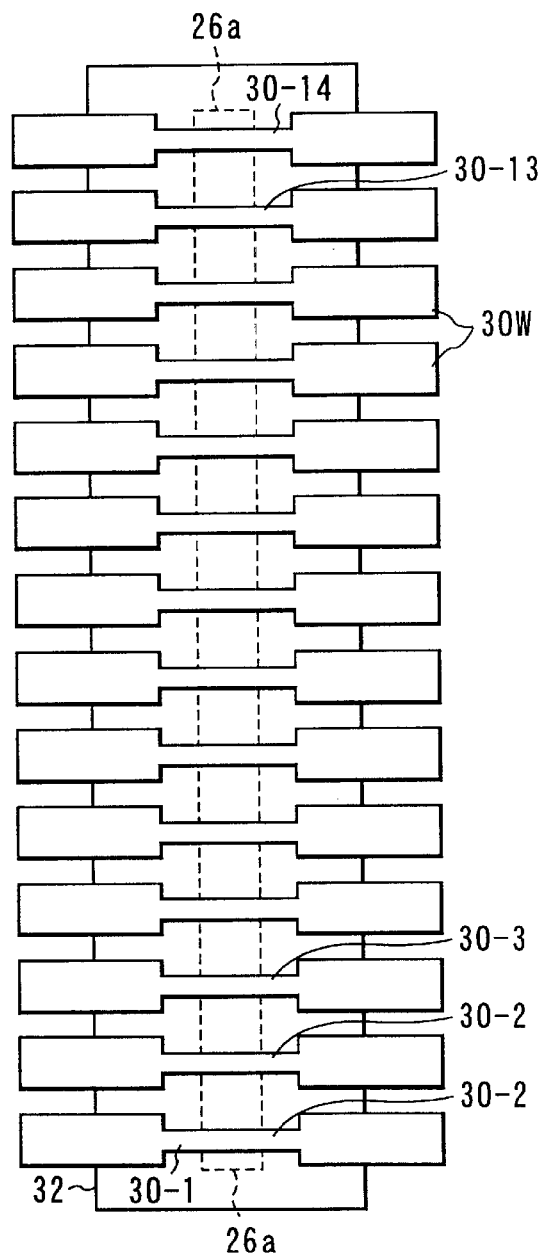
FIG. 11 is a plan view showing still another embodiment of this invention.

FIG. 11 is a plan view showing an embodiment using the common dummy pattern and portions which correspond to those of FIG. 9 are denoted by the same reference numerals and the explanation therefor is omitted.

In FIGS. 11, 14 narrow metal fuses 30-1 to 30-14 are formed in the intermediate portions of wide wiring portions 30W and a common dummy pattern 26a having an area smaller than that of the fuse window 32 is formed below the narrow metal fuses.

Since the dummy pattern 26a is commonly formed for all of the metal fuses, the area becomes extremely larger and the thermal capacity becomes larger in comparison with a case wherein the dummy patterns are separately formed. In other words, the dummy pattern 26a shown in FIG. 11 functions as a heat sink.

For example, since heat generated by application of laser is transmitted to the entire portion of the dummy pattern 26a even if one fuse 30-13 is blown by application of laser, the temperature of the dummy pattern 26a is not raised high and the wirings or elements formed in a portion directly below the dummy pattern 26a and its neighborhood are difficult to be damaged by the heat.

In the above embodiments, each of the dummy patterns 26a-1 to 26a-14 is not limited to a laminated structure of the aluminum dummy pattern 23a and the tungsten dummy pattern 25a, but it can be formed of a single-layered pattern. For example, it can be formed of a material or materials selected from aluminum, silicon, cobalt, tungsten, carbon, tantalum, titan, copper, nickel, molybdenum and ruthenium.

That is, as shown in FIG. 9 or 11, the presence of the dummy pattern 26 does not give a substantial influence on the integration density of the LSI by forming the dummy pattern 26 smaller than the fuse window 32 and the high integration density of the LSI can be attained by forming wirings or elements below the dummy pattern 26.

As described above, according to this invention, it becomes possible to provide a semiconductor device having a multi-layered wiring structure in which the number of manufacturing steps can be suppressed, the integration density can be enhanced and the stable operation can be attained after cut-off of the fuse or connection of the anti-fuse while wiring layers or elements formed below the fuses or anti-fuses can be made free from an influence by application of laser at the time of cut-off of the fuse or connection of the anti-fuse.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a multi-layered wiring structure formed on said semiconductor substrate;
   said multi-layered wiring structure including wirings having fuses formed in a predetermined wiring layer and a dummy pattern formed of a metal laminated film formed in a wiring layer directly below the fuses, the dummy pattern being not connected to the fuses and kept at a floating state; and
   said fuses each having a laser-blow portion to which a laser beam is applied, and the dummy pattern being positioned at a point where it receives energy from said fuses in case of an application of the laser beam,
   wherein when said fuses are blown by the laser beam, only that portion blown by the laser beam is cut while the dummy pattern, positioned directly below the fuses blown by the laser beam is kept in a non-cut state.

2. The semiconductor device according to claim 1, wherein said fuses are formed in the uppermost wiring layer or in a wiring layer next to the uppermost wiring layer.

3. The semiconductor device according to claim 1, wherein a distance on the same plane between a wiring formed directly below said dummy pattern and said fuses is less than 4 microns.

4. The semiconductor device according to claim 1, wherein a distance on the same plane between a semiconductor element formed directly below said dummy pattern and said fuses is less than 4 microns.

5. The semiconductor device according to claim 1, wherein the area of said dummy pattern is not larger than 4 μm ×4 μm.

6. The semiconductor device according to claim 1, wherein the potential of said dummy pattern is set in an electrically floating state.

7. The semiconductor device according to claim 1, wherein said dummy pattern is fixed at a predetermined potential.

8. The semiconductor device according to claim 1, wherein said fuses are formed in the uppermost wiring layer or in a wiring layer next to the uppermost wiring layer.

9. The semiconductor device according to claim 1, wherein a distance on the same plane between a wiring formed directly below said dummy pattern and said fuses is less than 4 microns.

10. The semiconductor device according to claim 1, wherein a distance on the same plane between a semiconductor element formed directly below said dummy pattern and said fuses is less than 4 microns.

11. The semiconductor device according to claim 1, wherein the area of said dummy pattern is not larger than 4 μm ×4 μm.

12. The semiconductor device according to claim 1, wherein the potential of said dummy pattern is set in an electrically floating state.

13. The semiconductor device according to claim 1, wherein said dummy pattern is fixed at a predetermined potential.

14. The semiconductor device according to claim 1, wherein the dummy pattern is positioned beneath the fuses.

15. The semiconductor device according to claim 1, wherein the dummy pattern is positioned beneath the fuses.

16. A semiconductor device comprising:

a semiconductor substrate;

a multi-layered wiring substructure formed on said semiconductor substrate;

said multi-layered wiring structure including wirings having fuses or anti-fuses formed in a predetermined wiring layer and a dummy pattern formed of a metal laminated film formed in a wiring layer directly below the fuses or anti-fuses, the dummy pattern being not connected to the fuses or anti-fuses and kept at a floating state;

said fuses or anti-fuses each having a laser-blow portion to which a laser beam is applied, and the dummy pattern being positioned at a point where it receives energy from said fuses or anti-fuses in case of an application of the laser beam; and said dummy pattern having a multi-layered structure formed of at least two different metals, wherein when said fuses or anti-fuses are blown by the laser beam, only that portion blown by the laser beam is cut or connected while the dummy pattern, positioned directly below the fuses or anti-fuses blown by the laser beam is kept in a non-cut or non-connected state.

17. A semiconductor device comprising:

a semiconductor substrate;

a multi-layered wiring structure formed on said semiconductor substrate;

a passivation film formed on said multi-layered wiring structure; said multi-layered wiring structure including wirings having fuses formed in a predetermined wiring layer and a dummy pattern formed in a wiring layer directly below the fuses, the dummy pattern being not connected to the fuses and kept at a floating state, windows having openings formed above the fuses being formed in said passivation film and said dummy pattern being formed with an area not larger than an area of each of the windows; and said fuses each having a laser-blow portion to which a laser beam is applied, and the dummy pattern being positioned at a point where it receives energy from said fuses in case of an application of the laser beam, wherein when said fuses are blown by the laser beam, only that portion blown by the laser beam is cut while the dummy pattern, positioned directly below the fuses blown by the laser beam is kept in a non-cut state.

18. A semiconductor device comprising:

a semiconductor substrate;

a multi-layered wiring structure formed on said semiconductor substrate;

a passivation film formed on said multi-layered wiring structure;

said multi-layered wiring structure including wirings having fuses or anti-fuses formed in a predetermined wiring layer and a dummy pattern formed in a wiring layer directly below the fuses or anti-fuses, the dummy pattern being not connected to the fuses or anti-fuses and kept at a floating state, windows having openings formed above the fuses or anti-fuses being formed in said passivation film and said dummy pattern being formed with an area not larger than an area of each of the windows;

said fuses or anti-fuses each having a laser-blow portion to which a laser beam is applied, and the dummy pattern being positioned at a point where it receives energy from said fuses or anti-fuses in case of an application of the laser beam; and said dummy pattern having a multi-layered structure formed of at least two different metals, wherein when said fuses or anti-fuses are blown by the laser beam, only that portion blown by the laser beam is cut or connected while the dummy pattern, positioned directly below the fuses or anti-fuses blown by the laser beam is kept in a non-cut or non-connected state.

* * * * *